United States Patent
Liu (10) Patent No.: US 7,292,077 B2
(45) Date of Patent: Nov. 6, 2007

(54) PHASE-LOCK LOOP AND LOOP FILTER THEREOF

(75) Inventor: ChihMin Liu, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 17 days.

(21) Appl. No.: 11/122,657

(22) Filed: May 4, 2005

(65) Prior Publication Data

US 2006/0158234 A1 Jul. 20, 2006

(30) Foreign Application Priority Data

Jan. 18, 2005 (TW) ............... 94101387 A (51) Int. Cl.
*H03L 7/06* (2006.01)
(52) U.S. Cl. ...................... 327/156; 327/512

(58) Field of Classification Search ........ 327/147–148, 327/154–158, 162–163, 17, 25, 512, 513; 331/17, 25, DIG. 2; 375/373–376
See application file for complete search history.

(56) References Cited

U.S. PATENT DOCUMENTS 5,256,981 A * 10/1993 Fountain .................. 327/69
7,078,948 B2 * 7/2006 Dosho .................... 327/157

* cited by examiner

*Primary Examiner*—Linh My Nguyen
(74) *Attorney, Agent, or Firm*—J.C. Patents (57) ABSTRACT

A loop filter includes a first resistor, a first capacitor, and an amplifier with a specific gain. Wherein, the amplifier includes an input terminal coupled to an input terminal and an output terminal of the loop filter through the first resistor. In addition, the amplifier also includes an output terminal coupled to the input terminal of the amplifier through the first capacitor.

8 Claims, 9 Drawing Sheets

PHASE-LOCK LOOP AND LOOP FILTER THEREOF

CROSS-REFERENCE TO RELATED APPLICATION

This application claims the priority benefit of Taiwan application serial no. 94101387, filed on Jan. 18, 2005. All disclosure of the Taiwan application is incorporated herein by reference.

BACKGROUND OF THE INVENTION

1. Field of the Invention

The present invention relates to a loop filter, and more particularly to a loop filter structure with a high speed and a small area.

2. Description of the Related Art

Generally, sequencing is essential for electronic or computer systems. Accordingly, periodic clock signals and reference clock signals must be precisely synchronized. The phase-lock loop (PLL) is a widely used circuit which can precisely synchronize the frequency of output signals and frequency of input signals. The PLL usually is applied in a frequency synthesizer, multiplier, divider, single or multiple clock signal generator, clock signal recover circuit, and wireless communication apparatus.

Figure 1:
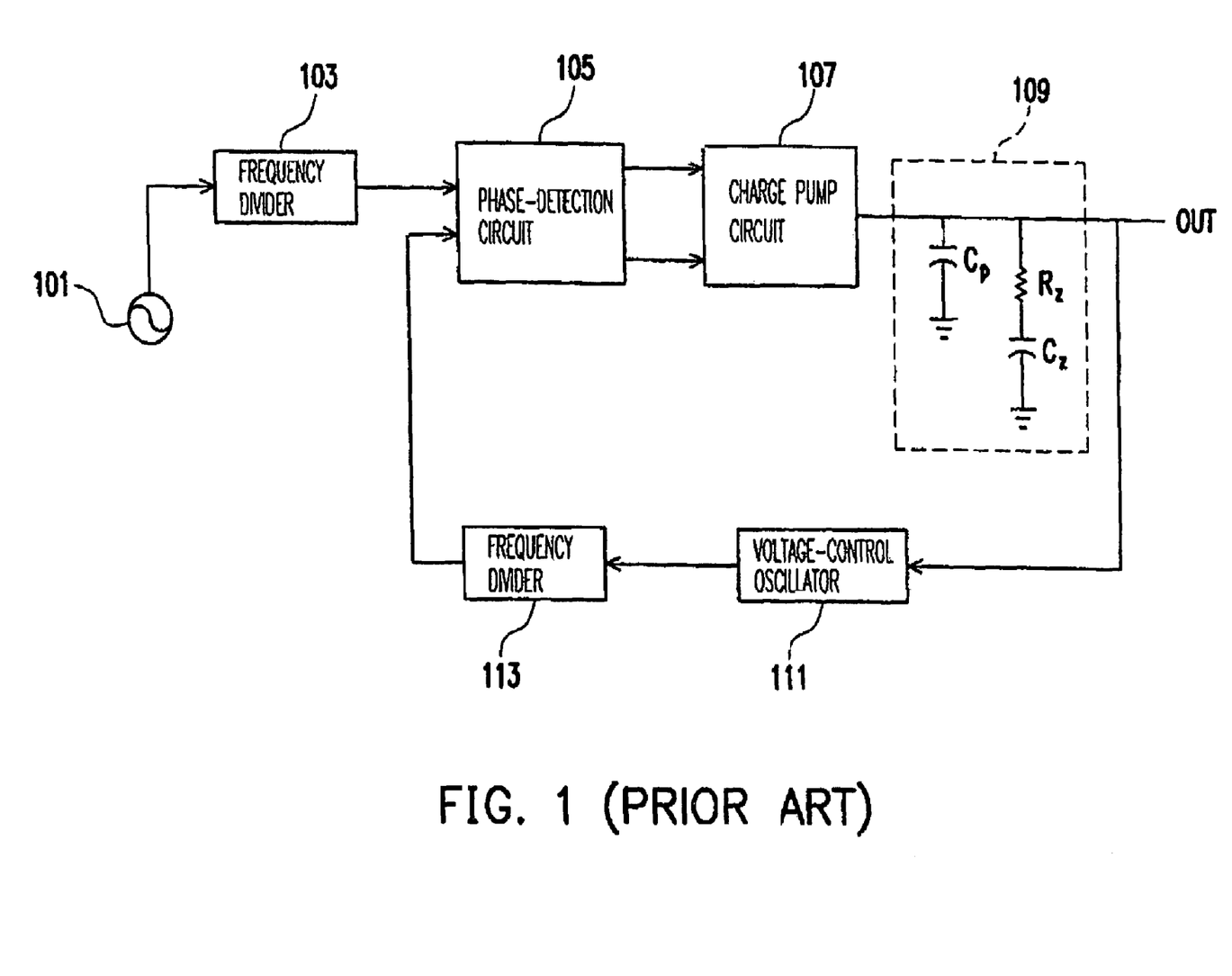
FIG. 1 is a circuit block diagram showing a conventional phase-lock loop.

FIG. 1 is a circuit block diagram showing a conventional phase-lock loop. Referring to FIG. 1, the output terminal of the oscillator 101, such as a quartz oscillator, is coupled to the frequency divider 103, and to the phase-detection circuit 105 through the phase divider 103. The phase-detection circuit 105 operates the loop filter 109 through the charge pump circuit 107. The output terminal of the loop filter 109 is coupled to the output terminal OUT of the phase-lock loop, and to the voltage-control oscillator 111. The voltage oscillator 111, according to the loop filter 109, transmits the output to the frequency divider 113, and the output of the frequency divider 113 is fed back to the input of the phase-detection circuit 105.

The loop filter 109 shown in FIG. 1 is a second-order loop filter. In detail, the order of the loop filter is determined by the number of its capacitors. The loop filter 109 comprises the capacitors Cp and Cz, and the resistor Rz. Wherein, the capacitor Cp is called a pole capacitor, which is used to provide a pole point in the system. One terminal of the capacitor Cp is coupled between the input terminal and the output terminal of the loop filter 109, and another terminal is grounded. In addition, the resistor Rz and the capacitor Cz provide a zero point in this system. Wherein, one terminal of the resistor Rz is coupled between the input terminal and the output terminal of the loop filter 109, and another terminal is grounded through the capacitor Cz.

Generally, the zero point is generated before the pole point. Accordingly, the capacitance of the capacitor Cz should be much larger than that of the capacitor Cp. As a result, the capacitor Cz has a great area. In order to reduce the capacitance of the capacitor Cz, and to generate the zero point before the pole point, a related technique is developed.

Figure 2:
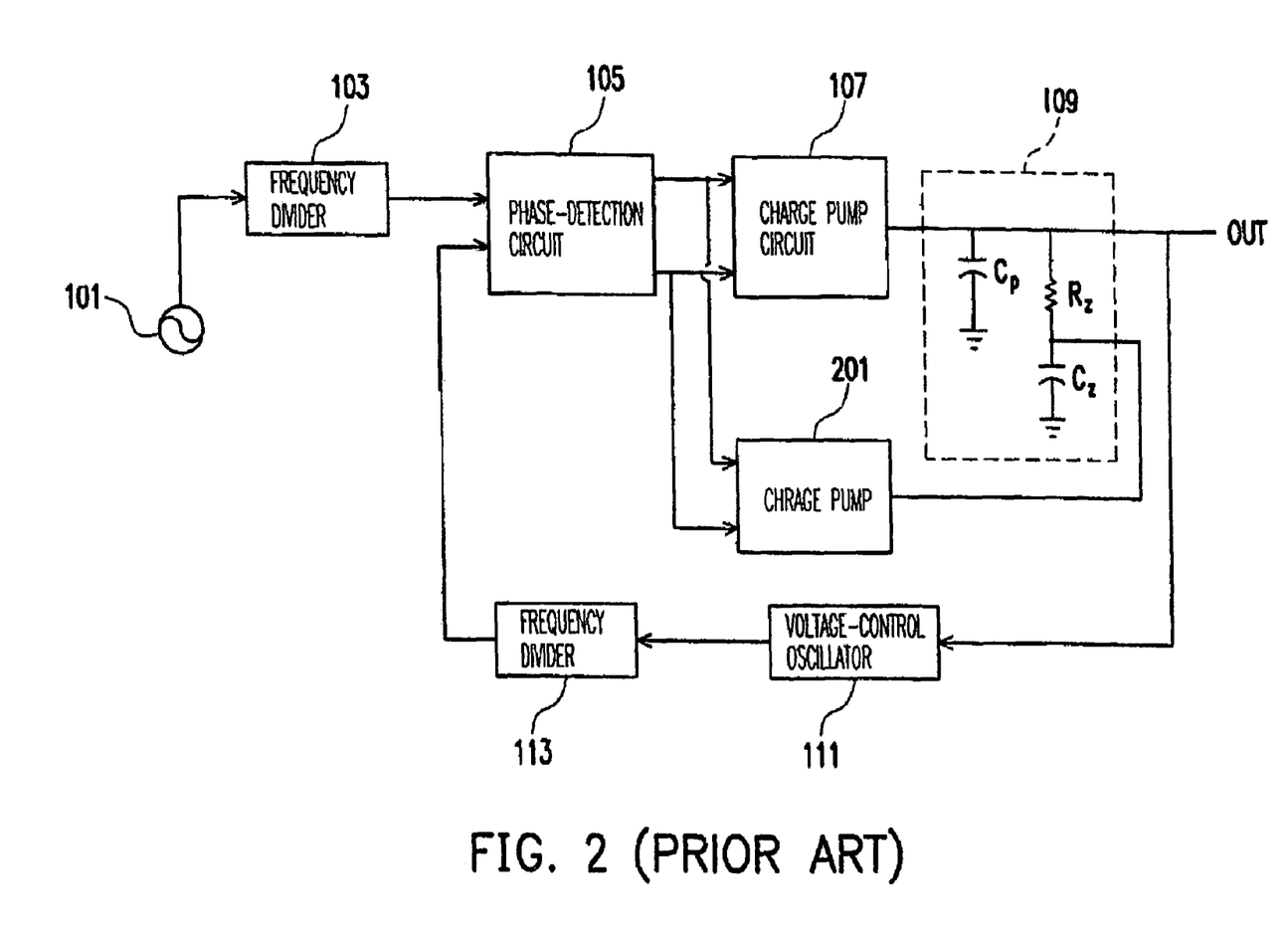
FIG. 2 is a circuit block diagram showing an improved phase-lock loop.

FIG. 2 is a circuit block diagram showing an improved phase-lock loop. Referring to FIG. 2, the phase-lock loop is the phase-lock loop of FIG. 1 with additional charge pump circuit 201. Wherein, the operation of the charge pump circuit 201 is contrary to that of the charge pump circuit 107. That is, when the charge pump circuit 107 charges the loop filter 109, the charge pump circuit 201 discharges the capacitor Cz, and vice versa. Accordingly, the current flowing through the capacitor Cz is reduced, and the capacitance of the capacitor Cz is reduced, too.

The phase-lock loop of FIG. 2, however, has a disadvantage. The additional charge pump circuit 201 in the phase-lock loop of FIG. 2 can reduce the capacitance of the capacitor Cz, and so reduce the area of the capacitor Cz, but the charge pump circuit 201 is added and so the area is increased. Moreover, there is mismatch issue between the charge pump circuits 107 and 201.

SUMMARY OF THE INVENTION

Accordingly, the present invention is directed to a phase-lock loop which has a smaller circuit area.

The present invention is also directed to a loop filter to improve the response speed of the circuit.

The present invention provides a loop filter comprising an input terminal and an output terminal, and also a first resistor, a second resistor. In addition, the present invention comprises an NMOS transistor, a first capacitor, a first PMOS transistor and a second PMOS transistor. A first source/drain of the NMOS transistor is grounded through the first resistor, and a gate of the NMOS transistor is coupled to the input terminal and the output terminal of the loop filter through the second resistor. A first capacitor is coupled between the gate and the second source/drain of the NMOS transistor. The first and the second PMOS transistors serve as a current mirror circuit. A first source/drain of the first PMOS transistor is coupled to the second source/drain of the NMOS transistor, and a second source/drain of the first PMOS transistor is coupled to a power source. In addition, a first source/drain of the second PMOS is grounded through a current source, a second source/drain of the second PMOS transistor is coupled to the power source, a gate of the second PMOS transistor is coupled to the gate of the first PMOS transistor, and to the second source/drain of the second PMOS transistor.

According to an embodiment of the present invention, another loop filter is provided, comprising an input terminal and an output terminal. The loop filter comprises a first NMOS transistor, a second NMOS transistor, a PMOS transistor, a first resistor, a second resistor and a first capacitor. The first and the second NMOS transistors serve as a current mirror circuit. A first source/drain of the first NMOS transistor is grounded. A first source/drain of the second NMOS transistor is grounded, a second source/drain of the second NMOS transistor is coupled to a common voltage through a current source, and a gate of the second NMOS transistor is coupled to a gate of the first NMOS transistor, and to a second source/drain of the second NMOS transistor. In addition, a first source/drain of the PMOS transistor is coupled to a second source/drain of the first NMOS transistor. A second source/drain of the PMOS transistor is coupled to the common voltage through the first resistor. A gate of the PMOS transistor is coupled to the input terminal and the output terminal of the loop filter through the second resistor. The first capacitor is coupled between the first source/drain and the gate of the PMOS transistor.

In another aspect, the present invention provides a loop filter, which comprises a first resistor, a first capacitor and an amplifier with a specific gain. Wherein, the amplifier comprises an input terminal, which is coupled to the input terminal and the output terminal of the loop filter through the first resistor. In addition, the amplifier also comprises an output terminal, which is coupled to the input terminal of the amplifier through the first capacitor.

Additionally, the present invention also provides a phase-lock loop, which comprises a loop filter. The loop filter comprises a first resistor, a first capacitor and an amplifier with a specific gain. Wherein, the amplifier comprises an input terminal, which is coupled to the input terminal and the output terminal of the loop filter through the first resistor. In addition, the amplifier also comprises an output terminal, which is coupled to the input terminal of the amplifier through the first capacitor.

Accordingly, the present invention has at least the following advantages:

1. The capacitor of the loop filter is coupled between the input and output terminals of the amplifier. The Miller effect would occur at the input terminal of the amplifier. As a result, a small capacitor can be used in the present invention to generate a great capacitance such that the present invention can substantially reduce the area of the capacitor.
2. Since a smaller capacitor can be used, the time for charging and discharging the capacitor can be reduced such that the operational speed of the phase-lock loop of the present invention can be enhanced.

The above and other features of the present invention will be better understood from the following detailed description of the embodiments of the invention that is provided in communication with the accompanying drawings.

DESCRIPTION OF SOME EMBODIMENTS

Figure 3:
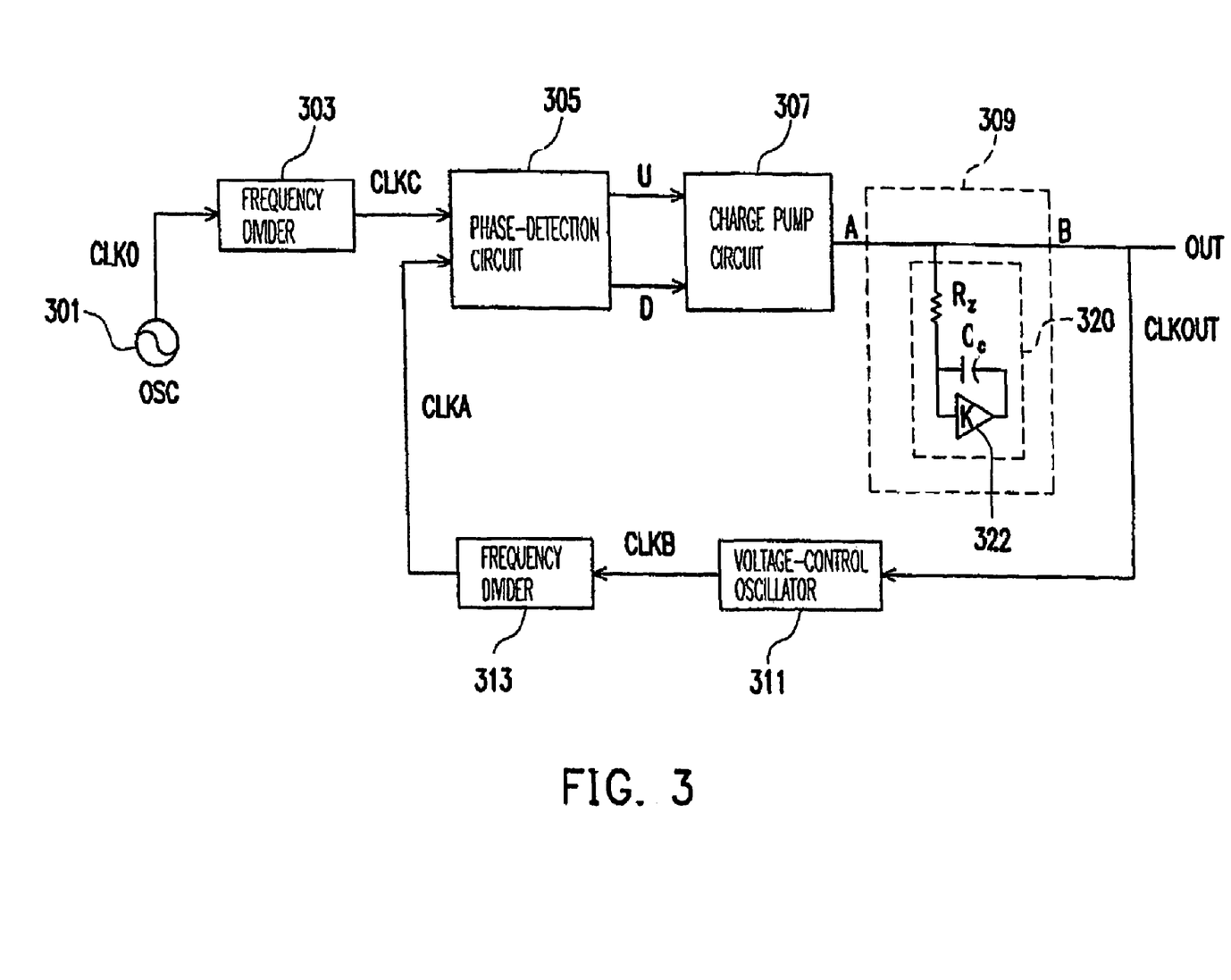
FIG. 3 is a circuit block diagram showing a phase-lock loop according to an embodiment of the present invention.

FIG. 3 is a circuit block diagram showing a phase-lock loop according to an embodiment of the present invention. Referring to FIG. 3, the output of the oscillator 301 is transmitted to the frequency divider 303. The output terminal of the oscillator 303 is also coupled to the phase-detection circuit 305 through the frequency divider 303. The phase-detection circuit 305 charges or discharges the loop filter 309 through the charge pump circuit 307. The output terminal B of the loop filter 309 is coupled to the output terminal OUT of the phase-lock loop of the present invention, and also coupled to the input terminal of the voltage-control oscillator 311. According to the loop filter 309, the output of the voltage-control oscillator 311 is coupled to the frequency divider 313, and also coupled to the input of the phase-detection circuit 305 through the frequency divider 313.

Wherein, the oscillator 301 can be, for example, a quartz oscillator to generate the reference clock signal CLK0. The frequency divider 303 divides the frequency of the reference clock signal CLK0 with a pre-determined value, and outputs the comparison clock signal CLKC to the phase-detection circuit 305. The phase-detection circuit 305 compares the phase of the clock signal CLKC and the phase of the clock signal CLKA. If the phase of the clock signal CLKA leads the phase of the clock signal CLKC, the phase-detection circuit 305 outputs a lead signal D to the charge pump circuit 307. If the phase of the clock signal CLKA falls behind the phase of the clock signal CLKC, the phase-detection circuit 305 outputs a lag signal U to the charge pump circuit 307.

Figure 4:
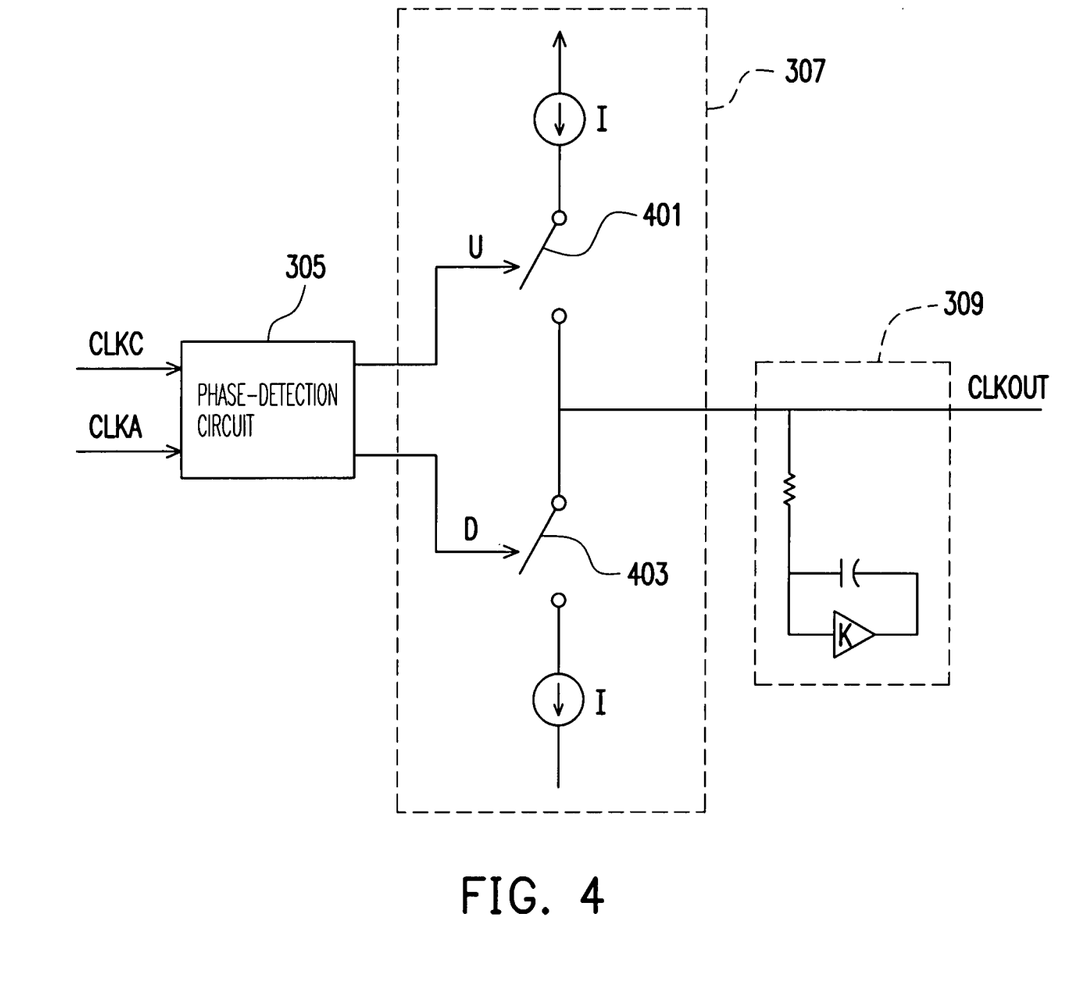
FIG. 4 is a schematic drawing showing a charge pump circuit according to an embodiment of the present invention.

FIG. 4 is a schematic drawing showing a charge pump circuit according to an embodiment of the present invention. Referring to FIG. 4, the charge pump circuit 307 comprises switches 401 and 403. Whether the switches 401 and 403 are turned on or off is determined by the phase-detection circuit 305. If the phase of the clock signal CLKA is determined to lead the phase of the clock signal CLKC, the phase-detection circuit 305 outputs a lead signal D to the charge pump circuit 307 to turn on the switch 403. After the switch 403 is turned on, the current I flows out from the loop filter 309. That is, the loop filter 309 is discharged.

If the phase of the clock signal CLKA is determined to lag behind the phase of the clock signal CLKC, the phase-detection circuit 305 outputs a lag signal U to the charge pump circuit 307 to turn on the switch 401. After the switch 401 is turned on, the current I flows from the charge pump circuit 307 to the loop filter 309. That is, the charge pump circuit 307 charges the loop filter 309. By alternatively charging/discharging the loop filter 309, the loop filter 309 generates the output clock signal CLKOUT.

Referring to FIG. 3, the output clock signal CLKOUT is not only output from the output terminal OUT of the phase-lock loop of the present invention, but also transmitted to the voltage-control oscillator 311. The voltage-control oscillator 311 generates and outputs the clock signal CLKB to the frequency divider 313 for dividing the frequency according to the output clock signal CLKOUT. After the frequency divider 313 divides the clock signal CLKB, the clock signal CLKA is generated and fed back to the phase-detection circuit 305. Through the feed-back, the frequency of the output clock signal CLKOUT and the frequency of the reference clock signal CLKC can be synchronized.

The loop filter 309 comprises a zero-point-providing circuit 320. As the name suggests, the zero-point-providing circuit 320 provides zero points. In the present invention, the zero-point-providing circuit 320 comprises the resistor Rz, the capacitor Cc and the amplifier 322 with a gain K. In the present invention, the capacitor Cc and the amplifier 322 constitute the capacitor Cz shown in FIG. 1. The area of the capacitor Cc and the amplifier 322 is still smaller than that of the capacitor Cz. Wherein, the input terminal of the amplifier 322 is coupled between the input terminal A and the output terminal B of the loop filter 309 through the resistor Rz. The capacitor Cc is coupled between the input terminal and the output terminal of the amplifier 322.

Figure 5:
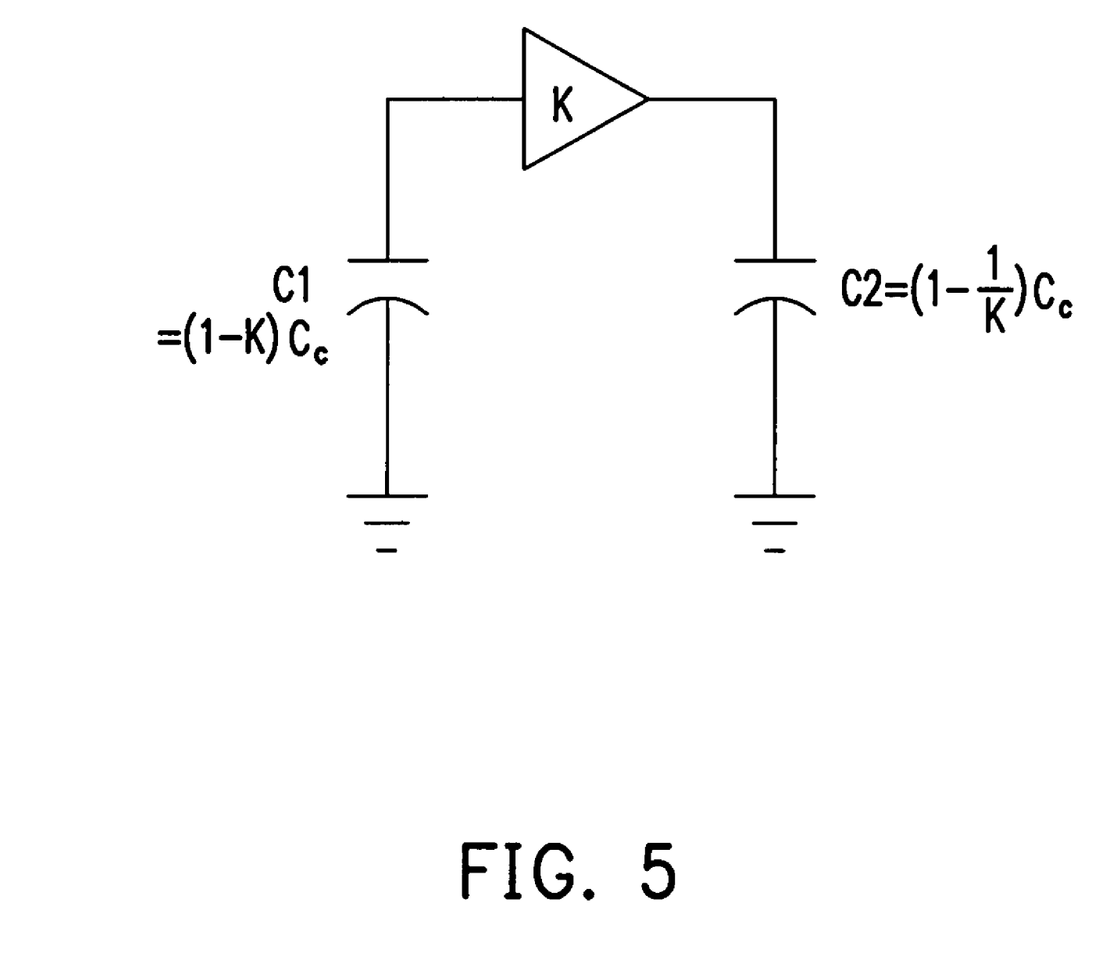
FIG. 5 is a schematic drawing showing a Miller equivalent circuit.

According to the Miller principle, the capacitor Cc of the amplifier 322 is equivalent to the equivalent circuit shown in FIG. 5. In FIG. 5, the input capacitance C1 of the amplifier 322 is equal to $(1-K)Cc$. The output capacitance C2 is equal to $(1-1/K)Cc$. Wherein, K can be negative, and obtained from the negative feed-back amplifier circuit. Accordingly, one of ordinary skill in the art will know that by modifying the gain K of the amplifier 322, the small capacitor Cc can be used to generate a great capacitance.

The following are two embodiments of the zero-point-providing circuit.

Figure 6A:
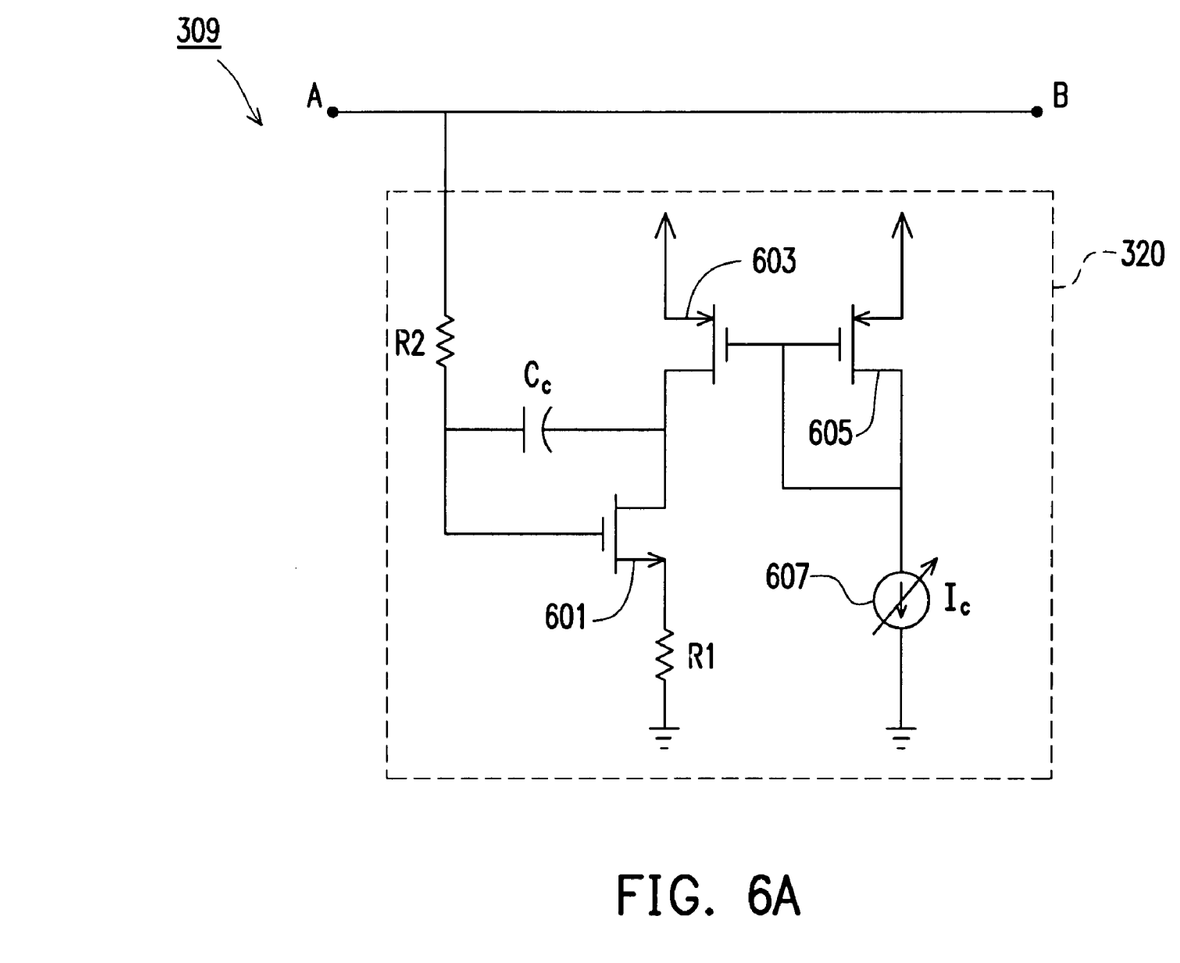
FIG. 6A is a drawing showing a loop filer according to the first embodiment of the present invention.

FIG. 6A is a drawing showing a loop filer according to the first embodiment of the present invention. Referring to FIG. 6A, the zero-point-providing circuit 320 comprises the NMOS transistor 601 and the PMOS transistors 603 and 605. Wherein, the first source/drain of the NMOS transistor 601 is grounded through the resistor R1. Its gate is coupled between the input terminal A and the output terminal B of the loop filter 309 through the resistor R2. The capacitor Cc is coupled between the gate and the second source/drain of the NMOS transistor 601.

The PMOS transistors 603 and 605 constitute a current mirror circuit. Wherein, the first source/drain of the PMOS transistor 603 is coupled to the second source/drain of the NMOS transistor 601, and the second source/drain of the PMOS transistor 603 is coupled to a voltage source. The gate of the PMOS transistor 603 is coupled to the gate of the PMOS transistor 605. The second source/drain of the PMOS transistor 605, similar to the second source/drain of the PMOS transistor 603, is coupled to the voltage source. The first source/drain of the PMOS transistor 605 is coupled to the gate of the PMOS transistor 605, and is grounded through the current source 607. In the present invention, the current of the current source 607 flows from the PMOS transistor 605 to the ground terminal, and the current Ic is adjustable.

In this embodiment, the PMOS transistors 603 and 605 constitute a current mirror structure so that the current Ic can be mirrored to the first source/drain of the PMOS transistor 603. In addition, the sum of the resistance of the resistors R1 and R2 is equal to the resistance of the resistor Rz shown in FIG. 3. Accordingly, by adjusting the resistance of the resistors R1 and R2, the NMOS transistor 601 can function in the active region.

Figure 6B:
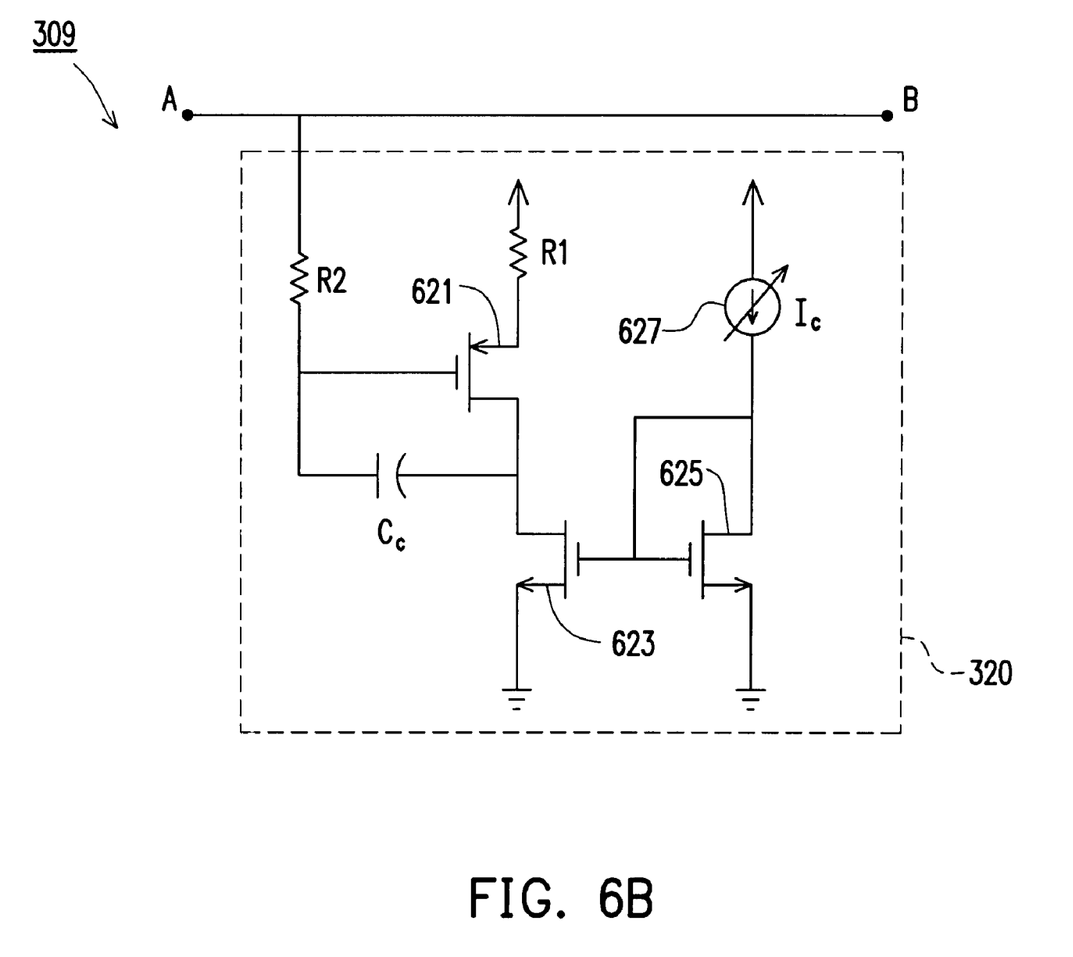
FIG. 6B is a drawing showing a loop filter according to the second embodiment of the present invention.

FIG. 6B is a drawing showing a loop filter according to the second embodiment of the present invention. Referring to FIG. 6B, the zero-point-providing circuit 320 comprises the PMOS transistor 621, and the NMOS transistors 623 and 625. Wherein, the first source/drain of the NMOS transistor 623 is grounded. The gate of the NMOS transistor 623 is coupled to the gate of the NMOS transistor 625. The first source/drain of the NMOS transistor 625 is grounded, and its second source/drain is coupled to a voltage source through the current source 627, and to the gate of the NMOS transistor 625. Accordingly, the NMOS transistors 623 and 625 constitute a current mirror circuit structure. Wherein, the current Ic of the current source 627 is adjustable, and the current Ic flows to the NMOS transistor 625.

In addition, the second source/drain of the PMOS transistor 621 is coupled to the voltage source through the resistor R1, and its gate is coupled between the input terminal A and the input terminal B of the loop filter through the resistor R2. The first source/drain of the PMOS transistor 621 is coupled to the second source/drain of the NMOS transistor 623, and to the gate of the PMOS transistor 621 through the capacitor Cc. Similarly, the sum of the resistance of the resistors R1 and R2 is equal to the resistance of the resistor Rz shown in FIG. 3. By adjusting the resistance of the resistors R1 and R2, the PMOS transistor 621 can function in the active region.

Though two loop filter structures are disclosed above, the present invention, however, is not limited thereto. One of ordinary skill in the art knows that the key point of the present invention is that the capacitor of the zero-point-providing circuit is coupled between the input terminal and the output terminal of the amplifier to generate the Miller effect. Any method and circuit capable of generating the Miller effect all fall within the scope of the present invention.

The loop filter 309 in FIG. 3 is called a first-order loop filter. Its function is to provide zero points in the frequency response of the system to enhance the phase margin of the frequency response of the system. The present invention, however, is not limited to the first-order loop filter.

Figure 7:
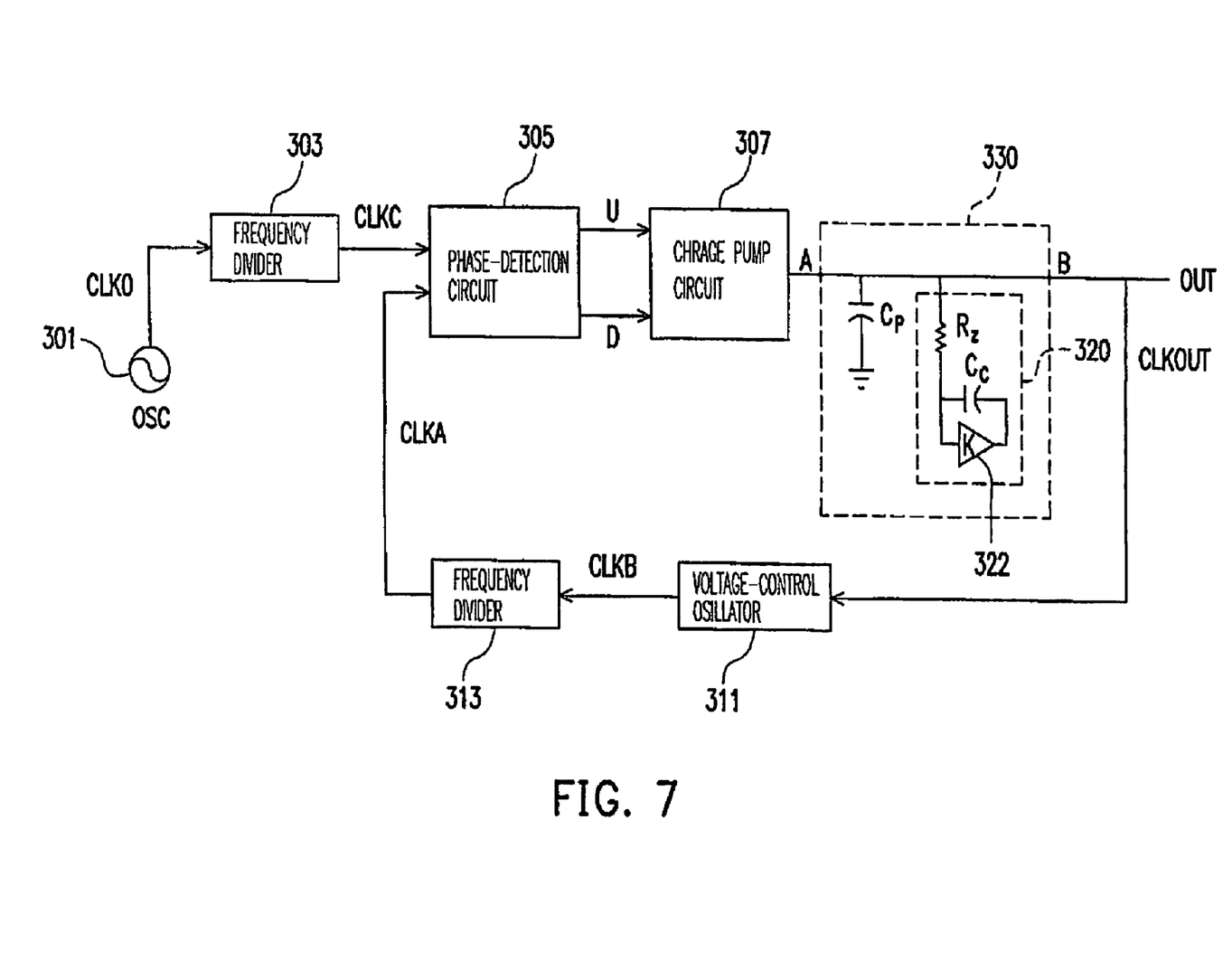
FIG. 7 is a circuit block diagram showing a phase-lock loop according to another embodiment of the present invention.

FIG. 7 is a circuit block diagram showing a phase-lock loop according to another embodiment of the present invention. The phase-lock loop in FIG. 7 is an improvement from the one in FIG. 3. The difference is the loop filter 309 in FIG. 7 includes a capacitor Cp. One terminal of the capacitor Cp is coupled to the terminal A of the loop filter 330, and to the input terminal of the amplifier 322, such as the gate of the NMOS transistor 601 in FIG. 6A or the gate of the PMOS transistor 621 in FIG. 6B, through the resistor Rz.

In this embodiment, the loop filter 330 is a second-order loop filter. Within the frequency response of the system, the loop filter 330 provides zero points as well as a pole point.

Figure 8:
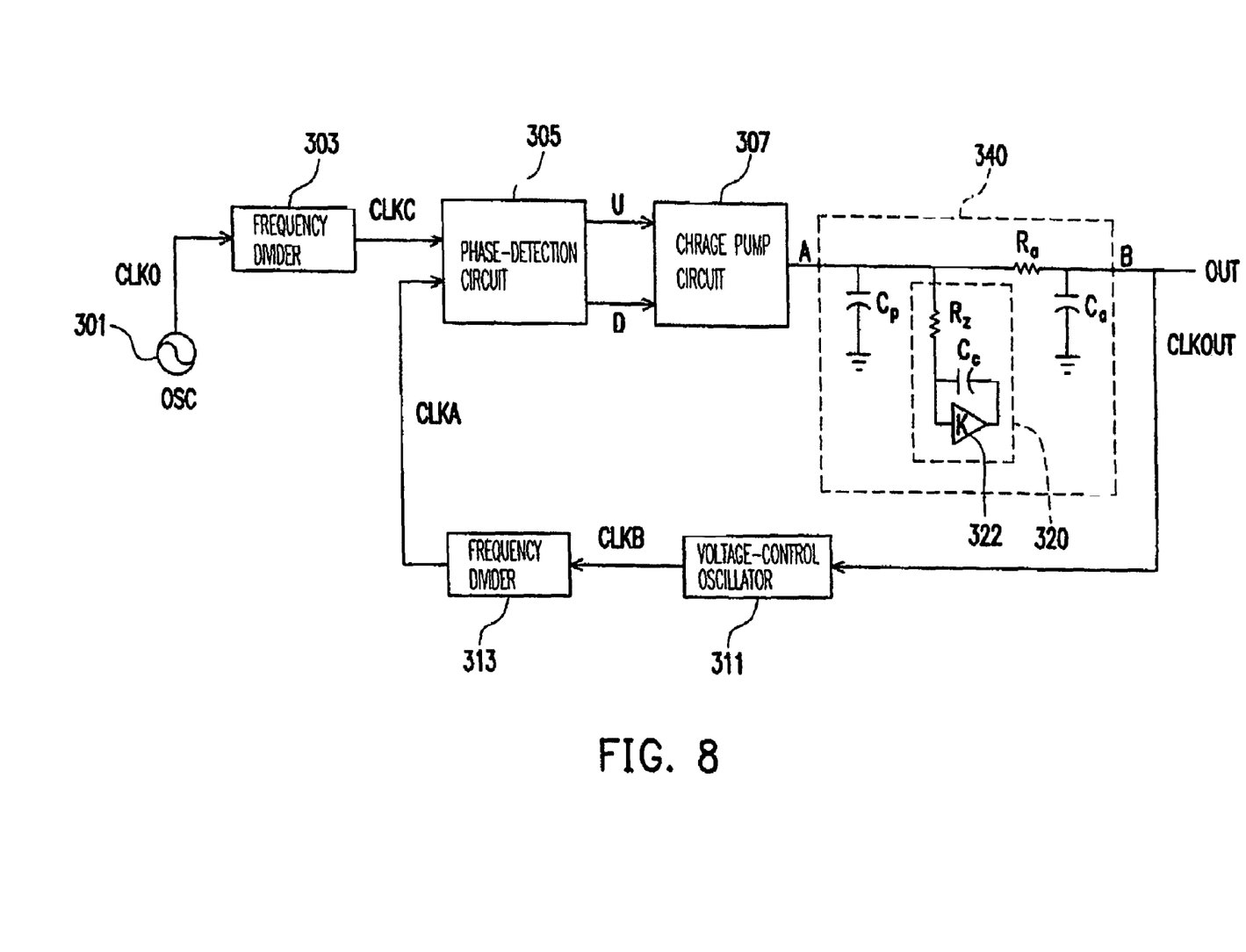
FIG. 8 is a circuit block diagram showing another phase-lock loop according to another embodiment of the present invention.

FIG. 8 is a circuit block diagram showing another phase-lock loop according to an embodiment of the present invention. The phase-lock loop in FIG. 8 is an improvement from the one in FIG. 7. The difference is that the loop filter 340 in FIG. 7 includes a resistor Ra and a capacitor Ca. Wherein, one terminal of the resistor Ra is coupled to the output terminal B of the loop filter 340, and another terminal is coupled to the input terminal of the amplifier 322, such as the gate of the NMOS transistor 601 in FIG. 6A or the gate of the PMOS transistor 621 in FIG. 6B, through the resistor Rz. One terminal of the capacitor Ca is coupled between the output terminal B of the loop filter 340 and the resistor Ra, and another terminal is grounded. In this embodiment, the loop filter 340 is a third-order loop filter.

Accordingly, in the loop filter of the present invention, the capacitor is coupled between the input terminal and the output terminal of the amplifier to cause the Miller effect. Accordingly, a small capacitor can be used to generate a great capacitance in the present invention. Thus, the circuit dimension of the present invention can be reduced, and the whole circuit can normally function. In addition, since a small capacitor is used in the present invention, the time for charging and discharging can be reduced. Accordingly, the operational speed of the phase-lock loop of the present invention can be improved.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A loop filter, with only an input terminal and an output terminal, the loop filter comprising:
   a first resistor, comprising a first terminal and a second terminal, wherein only the first terminal is coupled to the input terminal and the output terminal of the loop filter;
   a first capacitor, comprising a third terminal and a fourth terminal, wherein the third terminal is coupled to the second terminal; and
   an amplifier with a gain, comprising an input terminal and an output terminal, wherein the input terminal of the amplifier is coupled to the third terminal, and the output terminal of the amplifier is coupled to the fourth terminal.

2. The loop filter of claim 1, further comprising a second capacitor, wherein a terminal of the second capacitor is coupled to the input terminal of the loop filter, and to the input terminal of the amplifier through the first resistor; and another terminal of the second capacitor is grounded.

3. The loop filter of claim 2, further comprising:
a second resistor, wherein a terminal of the second resistor is coupled to the input terminal of the loop filter, and to the input terminal of the amplifier through the first resistor, and another terminal of the second resistor is coupled to the output terminal of the loop filter; and
a third capacitor, wherein a terminal of the third capacitor is coupled to the output terminal of the loop filter, and another terminal of the third capacitor is grounded.

4. A phase-lock loop, comprising:
an oscillator outputting a reference clock signal;
a first frequency divider dividing the reference clock signal and outputting a first clock signal;
a phase-detection circuit comparing the first clock signal and a second clock signal and generating a comparison result;
a charge pump circuit receiving the comparison result;
a loop filter with only an input terminal coupled to an output terminal of the charge pump circuit and an output terminal, wherein the charge pump circuit controls the charging or discharging of the loop filter according to the comparison result, and the loop filter comprises:
a first resistor comprising a first terminal and a second terminal, wherein only the first terminal is coupled to the input terminal and the output terminal of the loop filter;
a first capacitor, comprising a third terminal and a fourth terminal, wherein the third terminal is coupled to the second terminal; and
an amplifier with a gain, comprising an input terminal and an output terminal, wherein the input terminal of the amplifier is coupled to the third terminal, and the output terminal of the amplifier is coupled to the fourth terminal;
a voltage-control oscillator generating a third clock signal according to an output from the loop filter; and
a second frequency divider dividing the third clock signal and generating the second clock signal to the phase-detection circuit.

5. The phase-lock loop of claim 4, wherein the loop filer further comprises a second capacitor, a terminal of the second capacitor is coupled to the input terminal of the loop filter, and to the input terminal of the amplifier through the first resistor, and another terminal of the second capacitor is grounded.

6. The phase-lock loop of claim 5, wherein the loop filter further comprises:
a second resistor, wherein a terminal of the second resistor is coupled to the input terminal of the loop filter, and to the input terminal of the amplifier through the first resistor, and another terminal of the second resistor is coupled to the output terminal of the loop filter; and
a third capacitor, wherein a terminal of the third capacitor is coupled to the output terminal of the loop filter, and another terminal of the third capacitor is grounded.

7. The loop filter of claim 1, further comprising:
a second resistor;
an NMOS transistor, a source of the NMOS transistor being grounded through the first resistor, a gate of the NMOS transistor being coupled to the input terminal and the output terminal of the loop filter through the second resistor;
a first PMOS transistor, a drain of the first PMOS transistor being coupled to the drain of the NMOS transistor, a source of the first PMOS transistor being coupled to a power source; and
a second PMOS transistor, a drain of the second PMOS transistor being grounded through a current source, a source of the second PMOS transistor being coupled to the power source, a gate of the second PMOS transistor being coupled to the gate of the first PMOS transistor, and to the drain of the second PMOS transistor.

8. The loop filter of claim 1, further comprising:
a second resistor;
a first NMOS transistor, a source of the first NMOS transistor being grounded, a drain of the second NMOS transistor being coupled to a common voltage through a current source, and a gate of the second NMOS transistor being coupled to a gate of the first NMOS transistor, and a drain of the second NMOS transistor; and
a PMOS transistor, a drain of the PMOS transistor being coupled to a drain of the first NMOS transistor and to a gate of the PMOS transistor through the first capacitor, the gate of the PMOS transistor being coupled to the input terminal and the output terminal through the second resistor, a drain of the PMOS transistor being coupled to the common voltage through the first resistor.

* * * * *